United States Patent
Paak

(10) Patent No.: US 7,746,696 B1
(45) Date of Patent: Jun. 29, 2010

(54) CMOS TWIN CELL NON-VOLATILE RANDOM ACCESS MEMORY

(75) Inventor: Sunhom Paak, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 162 days.

(21) Appl. No.: 12/042,266

(22) Filed: Mar. 4, 2008

(51) Int. Cl.
*G11C 14/00* (2006.01)
*G11C 11/34* (2006.01)

(52) U.S. Cl. ............ 365/185.08; 365/185.05; 365/185.14; 365/185.19; 365/202

(58) Field of Classification Search ............ None
See application file for complete search history.

(56) References Cited

U.S. PATENT DOCUMENTS

| | | | |
|---|---|---|---|
| 5,272,368 A | 12/1993 | Turner et al. | |
| 5,870,327 A | 2/1999 | Gitlin et al. | |
| 7,092,293 B1 | 8/2006 | Young et al. | |
| 7,301,194 B1 | 11/2007 | Paak et al. | |
| 7,301,811 B1 | 11/2007 | Paak | |
| 7,453,726 B1 * | 11/2008 | Poplevine et al. | 365/185.08 |
| 7,483,310 B1 * | 1/2009 | Bu | 365/185.26 |
| 2007/0247914 A1 * | 10/2007 | Fang et al. | 365/185.18 |

* cited by examiner

*Primary Examiner*—Huan Hoang
*Assistant Examiner*—James G Norman
(74) *Attorney, Agent, or Firm*—Scott Hewett

(57) ABSTRACT

A memory has first and second storage cells, each with a floating node, that store complementary data values. Interlaced inverters quickly sense a voltage difference between the storage cells and provide a data value output when the memory is read. Each floating node includes a tunneling gate of a tunneling transistor, a gate of a bitline transistor, and a plate of a coupling capacitor.

16 Claims, 5 Drawing Sheets

CMOS TWIN CELL NON-VOLATILE RANDOM ACCESS MEMORY

FIELD OF THE INVENTION

This invention relates generally to integrated circuits, and more particularly to electronically erasable, programmable read-only memory.

BACKGROUND OF THE INVENTION

Various types of memory are used with integrated circuits ("ICs"). Volatile memory is a type of memory that loses its stored information when power is removed from the memory circuit. Random access memory ("RAM") is an example of volatile memory. A RAM cell can be easily reprogrammed to a desired logic state, and is often implemented in complementary metal-oxide-semiconductor (CMOS) logic. Non-volatile memory is a type of memory that preserves its stored information even if power is removed. Read-only memory ("ROM") is an example of non-volatile memory.

Programmable read-only memory ("PROM") is a type of memory that is configured to a desired state. A programming signal is applied to a PROM memory cell to change the cell from a first condition (i.e., first logic state) to a second condition (i.e., a second logic state). Programmable non-volatile memory is desirable in various integrated circuits including programmable logic devices ("PLDs"), such as field-programmable gate arrays ("FPGAs") and complex programmable logic devices ("CPLDs"). Some types of programmable non-volatile memory, such as anti-fuse based memory, can only be programmed once. Another type of programmable non-volatile memory, commonly called can be electronically programmed and erased several times. Examples of this type of non-volatile memory are commonly referred to as electronically erasable programmable read-only memory ("EEPROM") or, if used in a CMOS IC, "CMOS NV-memory".

Conventional CMOS NV-memory cells use floating conductive structures, such as floating poly-silicon ("poly") gate structures, to store charge. The stored charge creates an electrical potential that affects the conductivity of an underlying channel region of a field-effect transistor ("FET"). It is generally desirable that floating gates be easily programmable using typical voltages of the CMOS IC, and also desirable that the floating gates store charge for a long period of time so that the data value programmed into an NV memory cell remains valid. It is similarly desirable that one type of data value (e.g., a logical "1") be easily distinguished from a second type of data value (e.g., a logical "0"). However, compromises must be made to balance the various attributes desired in CMOS NV-memory.

On approach uses relatively thick dielectric (gate oxide) between the floating gate and charge source (e.g., channel region). The thick oxide provides good charge retention, but makes programming difficult and de-couples the floating gate from the channel region during VERIFY or READ operations. In other words, greater charge must be transferred to the floating gate to get the same change in threshold voltage $V_T$ that would be obtained by a thinner gate oxide. Unfortunately, thinner oxides leak charge off the floating gate, which degrades the effectiveness of the memory cell, and will eventually lead to loss of the data value stored in the memory cell. Other approaches periodically check the value of the memory cell to insure it is above an operating margin, and refresh the memory cell if it has degraded below the operating margin. However, such an approach uses additional resources for the comparison file and refresh operation.

It is desirable to provide a CMOS non-volatile memory cell that avoids the problems of the prior art.

SUMMARY OF THE INVENTION

A memory has first and second storage cells, each with a floating node, that store complementary data values. Interlaced inverters quickly sense a voltage difference between the storage cells and provide a data value output when the memory is read. Each floating node includes a tunneling gate of a tunneling transistor, a gate of a bitline transistor, and a plate of a coupling capacitor.

DETAILED DESCRIPTION OF THE DRAWINGS

Figure 1:
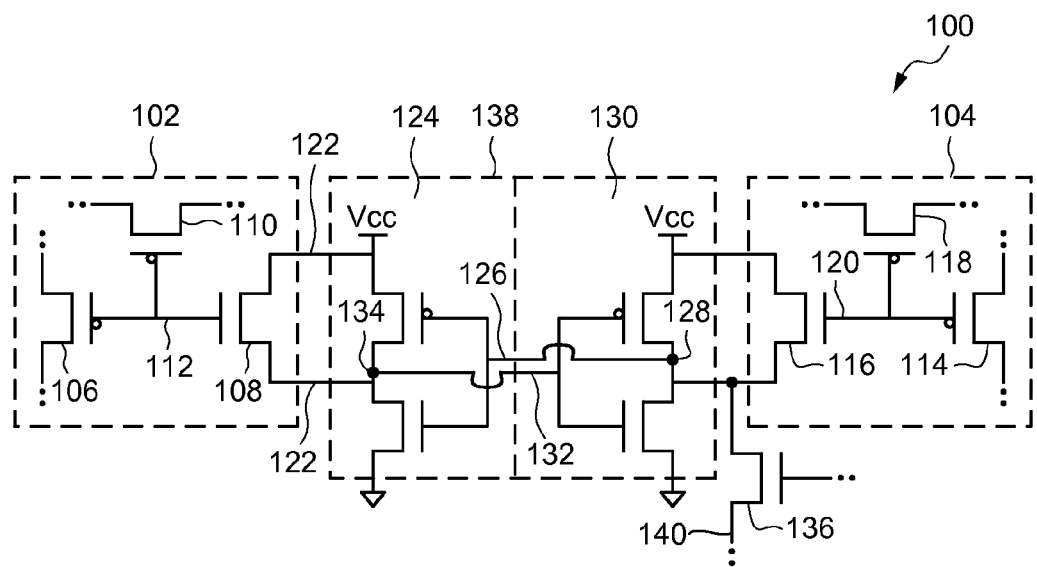
FIG. 1 is a circuit diagram of a twin-cell CMOS NV RAM according to an embodiment.

FIG. 1 is a circuit diagram of a twin-cell CMOS NV RAM 100 according to an embodiment. The twin-cell CMOS NV RAM 100 has a first storage cell 102 and a second storage cell 104. In operation, the first storage cell 102 stores a first data value ("data", e.g., a logical "1") and the second storage cell 104 stores a second data value ("data_bar", e.g., a logical "0") that is the complement of the of the first data value. The data values and designations are merely exemplary and chosen only for purposes of convenient discussion. The twin-cell CMOS NV RAM provides a data value output 140 when read according to the circuit configuration. In other words, a twin-cell CMOS NV RAM can be configured to provide a data value output having the same logical value as the first data value, or can be configured to provide a data value output having the opposite logical value as the first data value. The logical value of the data value output depends on the data values stored in the storage cell and on how the sense circuit is configured, as is known in the art of RAM.

The first storage cell 102 and the second storage cell 104 are referred to as twin cells. The first storage cell 102 has a first tunneling transistor 106, a first bitline transistor (also known as a storage cell access transistor) 108 and a first coupling diffusion capacitor 110. A first floating node 112 acts as a plate 109 of the first coupling diffusion capacitor 110, and as a gate 105 for the first tunneling transistor 106 and a gate 107 for the first bitline transistor 108 (see also, e.g., FIG. 4). In a particular embodiment, the first floating node 112 is a polysilicon or amorphous silicon structure defined on a semiconductor substrate to provide the gates and capacitor plate described above (see FIG. 2). Other materials suitable for floating-gate-type structures are alternatively used.

The second storage cell 104 has a second tunneling transistor 114, a second bitline transistor 116 ("bitline_bar", since it provides the complementary data value as the first bitline transistor 108), and a second coupling diffusion capacitor 118. A second floating node 120 acts a plate of the second coupling diffusion capacitor 118, and as a gate for the second tunneling transistor 114 and a gate for the second bitline transistor 116. In a particular embodiment, the second storage cell 104 is substantially similar to the first storage cell 102. Alternatively, the second storage cell is different from the first storage cell. For example, one storage cell might use a PMOS device for the tunneling transistor and another storage cell an NMOS device, or both storage cells use an NMOS device for the tunneling transistor. Similarly, different well structures may be defined for the coupling diffusion capacitors.

The outputs (bitline value) 122 of the first storage cell 102 are electrically connected to a first inverter 124 at pull-up node 134. The operation of inverters is well known in the art of SRAM circuits, and a detailed description is therefore omitted. The input 126 of the first inverter 124 is connected to a pull-up node 128 of a second inverter 130, and the input 132 of the second inverter 130 is similarly connected. Alternatively, the inputs of the storage cells are connected to pull-down nodes of the inverters, or are otherwise connected. This connection of the first and second inverters is referred to as "back-to-back" or "interlaced" for purposes of discussion, and provides quick sensing of the data and data_bar states of the first and second storage cells 102, 104 as is well known in the art of SRAM memory devices.

The interlacing design of the bitline and bitline_bar outputs maintains charges in the storage cells, and is able to sense small signal differences between the twin cells, even if significant charge loss has occurred since the storage cell(s) was programmed. The twin-cell CMOS NV RAM is capable of being quickly read through the memory READ transistor 136 because the inverters provide basically rail-to-rail output. The combination of the first and second inverters 124, 130 will be referred to as an SRAM circuit 138 for purposes of convenient discussion.

In a particular embodiment, the dielectric layer (see FIGS. 3A-3C) under the floating node 112 is less than eighty Angstroms thick. In conventional EEPROM storage cells, dielectric layers greater than 80 Angstroms thick are used to avoid charge loss. Generally, a thinner dielectric layer results in greater charge loss after tunneling. If a thick dielectric layer is used for the bitline transistor 108, the electrical potential of the floating node 112 (i.e., the gate of the bitline transistor 108) will not have as much effect on the channel conductance, and will reduce the READ margin of the bitline transistor 108. Similarly, a thick dielectric layer between the plates of the coupling diffusion capacitor 110 reduces the capacitance for a given surface area. Reducing the dielectric thickness between the capacitor plates increases capacitance for a given area, or alternatively provides similar capacitance with a smaller capacitor footprint.

Interlacing the data of one storage cell with the data_bar of the other storage cell through back-to-back invertors forms electric fields that are favorable for maintaining the desired charge on the associated floating nodes, as discussed further in reference to FIG. 5, below. This allows a uniform gate dielectric layer not greater than 50 Angstroms thick in some embodiments. In a particular embodiment, the gate dielectric layer under polysilicon floating nodes is gate oxide layer not greater than 50 Angstroms thick. Other dielectric materials suitable for isolating floating-gate-type structures are alternatively used.

Figure 2:
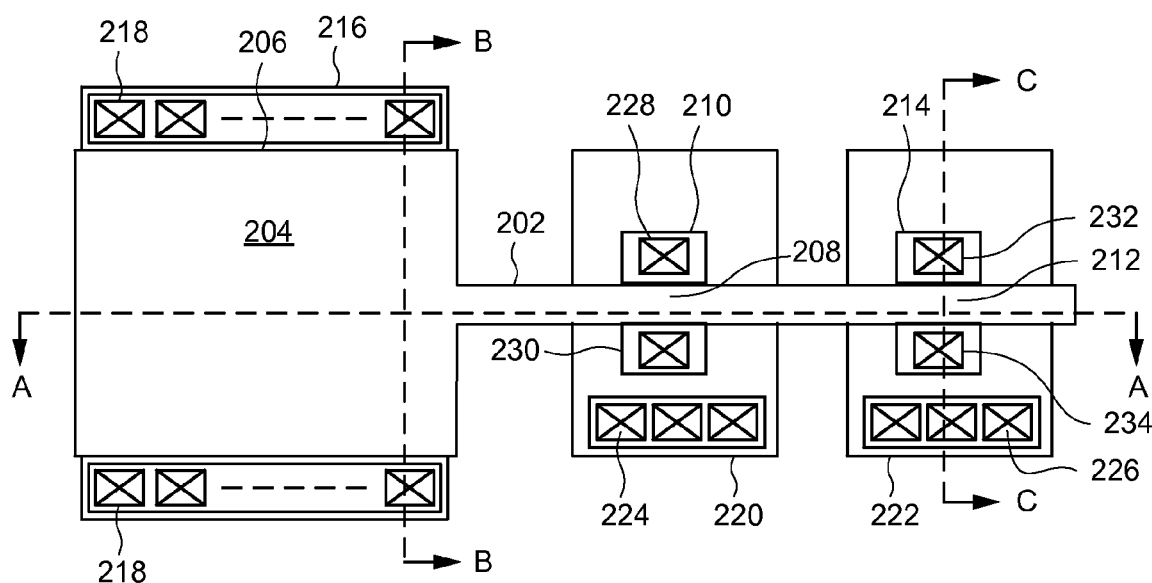
FIG. 2 is a plan view of an NV memory cell according to an embodiment.

FIG. 2 is a plan view of an NV memory cell 200 according to an embodiment. The NV memory cell 200 is the first storage cell 102 or the second storage cell 104 of FIG. 1, for example. A floating polysilicon structure (see, floating node 112, FIG. 1) 202 provides a plate 204 for coupling diffusion capacitor 206, a gate 208 for tunneling transistor 210, and a gate 212 for bitline transistor 214. A first well 216 forms the second plate of the coupling diffusion capacitor 206. Taps ("well taps") 218 provide electrical connection to the first well 216. The transistors 210, 214 are also formed in wells 220, 222, as is well-known in the art of CMOS fabrication. Taps 224, 226 provide electrical connections to the wells 220, 222. The well taps are typically silicided or heavily doped silicon regions. Contacts (see FIGS. 3B, 3C) electrically couple the well taps to overlying patterned metal layers (not shown) in the IC. Other contacts similarly connect the source/drain ("S/D") regions 228, 230, 232, 234 of the transistors 210, 214 to the overlying patterned metal layers.

Note that no contact is made to the floating polylsilicon structure 202. Charge is transferred to and from the floating node by phenomena commonly referred to as tunneling. Various types of tunneling, such as Fowler-Nordheim ("FN") and channel hot electron ("CHE") are known in the art. Particular details of storage cell construction, such as whether NMOS or PMOS devices are used, are selected according to the intended operation (e.g., bias conditions) of the storage cell. The types of wells formed in the silicon substrate depend on the types of devices used in the storage cell. In a particular embodiment, a large P-well is formed in a silicon substrate underneath the coupling capacitor 206 and both transistors, and an N-well is formed in the P-well underneath the coupling capacitor and the tunneling transistor 210. Thus, the tunneling transistor is a PMOS device and the bitline transistor is an NMOS device (as shown in FIG. 1, ref. num. 102). Alternative combinations of wells and device types are used in other embodiments.

Figure 3A:
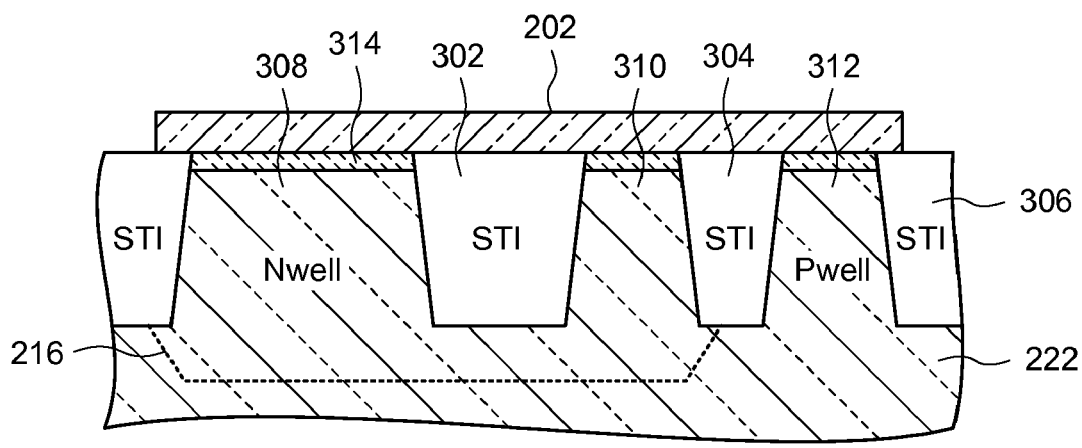
FIG. 3A is a cross section of the NV memory cell of FIG. 2 taken along section line A-A.

FIG. 3A is a cross section of the NV memory cell 200 of FIG. 2 taken along section line A-A. The N-well 216 is formed in the P-well 222 using conventional diffusion techniques. Isolation structures 302, 304, 306, such as trenches filled with dielectric material, electrically isolate the lower plate 308 of the coupling capacitor (see FIG. 2, ref. num. 204) from the channel 310 of the tunneling transistor (see FIG. 2, ref. num. 210), and the channel 310 of the tunneling transistor from the channel 312 of the bitline transistor (see FIG. 2, ref. num. 214). In a particular embodiment, a shallow trench isolation ("STI") technique is used. A gate dielectric layer 314 between the floating polysilicon structure 202 and the diffusion areas is less than about 80 Angstroms thick, and in a particular embodiment, is not greater than about 50 Angstroms.

Figure 3B:
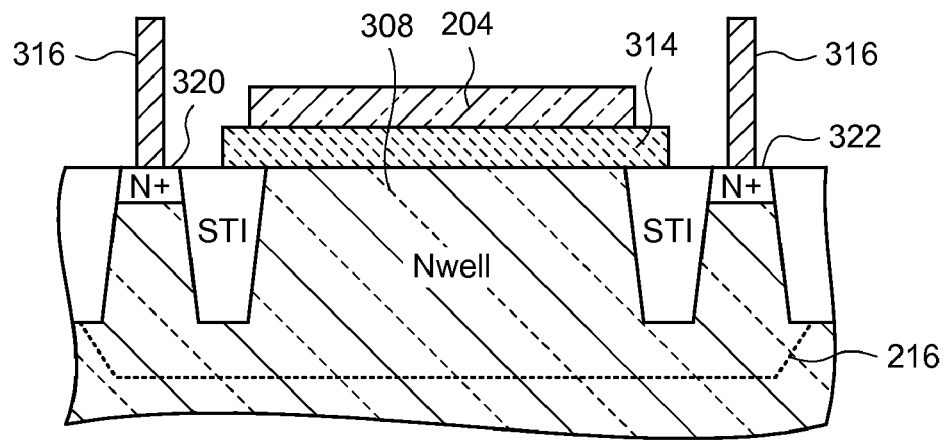
FIG. 3B is a cross section of the NV memory cell of FIG. 2 taken along section line B-B.

FIG. 3B is a cross section of the NV memory cell of FIG. 2 taken along section line B-B. Contacts 316, 318 electrically couple well taps 320, 322 to overlying metallization (also known as wiring or BEOL) patterns (not shown). The upper plate 204 is separated from the second plate 308 in the N-well 216 by the gate dielectric layer 314. Shallow trench isolation ("STI") structures or alternative isolation structures between the second plate 308 and the N+ regions 320, 322 provide a more uniform conversion region at the second plate 308. In other words, they block lateral current flow.

Figure 3C:
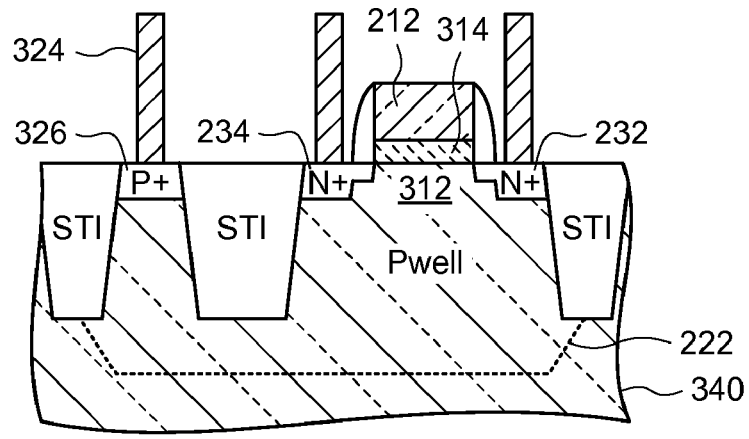
FIG. 3C is a cross section of the NV memory cell of FIG. 2 taken along section line C-C.

FIG. 3C is a cross section of the NV memory cell of FIG. 2 taken along section line C-C. FIG. 3C is a cross section of the bitline transistor 214 of FIG. 2. The gate 212 is shown in exaggerated vertical dimension for purposes of illustration. In a typical embodiment, the floating poly structure 202 of FIG. 2 has a fairly uniform thickness; however, this is not required. The gate 212 is separated from the channel 312 by the gate dielectric layer 314. Contacts 324, 326 electrically couple the S/D regions 232, 234 to overlying metallization patterns (not shown). Another contact 324 couples the well tap 326 to an overlying metal pattern. The silicon substrate 340 in which the P-well 222 is formed is shown in this view.

Figure 4A:
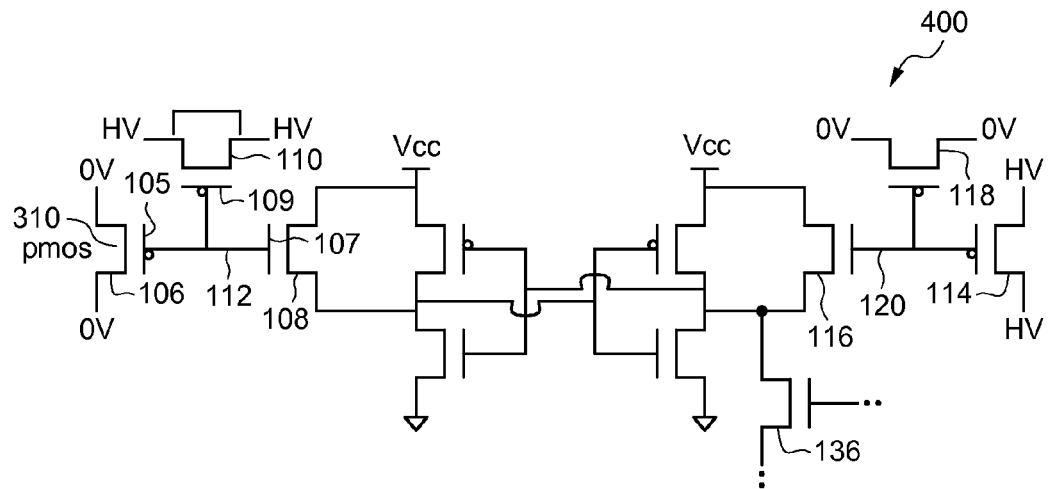
FIG. 4A is a circuit diagram of a twin-cell CMOS NV RAM suitable for Fowler-Nordheim programming according to an embodiment.

FIG. 4A is a circuit diagram of a twin-cell CMOS NV RAM 400 suitable for F-N programming according to an embodiment. The P-well ("pmos") (see FIG. 3C, ref. num. 340) is biased to $V_{CC}$, which is typically about five volts to about fifteen volts, while the S/D contacts of the first tunneling transistor 106 are held at zero volts (grounded). This produces a series capacitive voltage divider.

A high-voltage ("HV") pulse is applied to the well taps (see FIG. 2, ref. num. 218) of the first coupling diffusion capacitor 110. The coupling diffusion capacitor is physically larger and has greater capacitance than the gate of the tunneling transistor, which results in most of the applied voltage appearing at the gate of the tunneling transistor, facilitating charging of the floating poly structure through the gate of the tunneling transistor. The coupling diffusion capacitor enhances charge storage for the floating poly structure, allowing more charge to be stored for a given voltage, and maintaining a more consistent voltage at the floating node as charge is lost. In a particular embodiment, a 4-5 Volt bias is applied to the well taps of the first coupling diffusion capacitor 110 for a duration of about 10 msec. In a particular embodiment, the ratio of the capacitance of the diffusion capacitor to the gate capacitance of the tunneling transistor is at least 5:1. In a further embodiment, the ratio of the capacitance of the diffusion capacitor to the gate capacitance of the tunneling transistor is about 20:1.

Positively biasing the well taps of the first coupling diffusion capacitor attracts electrons from the channel 310 of the first tunneling transistor 106 through the gate oxide (see FIG. 3A, ref. num. 314) to the first floating node 112, which will be arbitrarily designated as having a value of data. The electrons negatively charge the first floating node 112, which increases the threshold voltage of the first bitline transistor 108 relative to the second bitline transistor 116, which is programmed to the opposite value, data_bar, as described below. During programming of the first storage cell, the S/D terminals of the tunneling transistor in the second storage cell are held at an intermediate value to avoid disturbing the programming of the first storage cell or the subsequent programming of the second storage cell.

Using a second programming sequence, the second memory cell is programmed to the complementary data value, data_bar, by grounding the well taps to the second coupling diffusion capacitor 118 and biasing the S/D terminals of the second tunneling transistor 114 to a high voltage (e.g., about 4-5 Volts in a particular embodiment) for a second duration of about 10 msec. The S/D terminal of the first tunneling transistor 106 are held at an intermediate value to avoid disturbing the programming value. The voltages and times used to program the second memory cell to data_bar are the same as those used to program the first memory cell to data; however, this is merely exemplary and not required.

Grounding the second plate (see FIG. 3A, ref. num. 308) of the second coupling diffusion capacitor 118 while biasing the S/D terminals of the second tunneling transistor 114 to a high voltage draws electrons from the second floating node 120 (or alternatively transfers holes to the second floating node), creating a relatively positive potential at the gate of the second bitline transistor 116. This reduces the threshold voltage of the second bitline transistor 116 relative to the first bitline transistor 108, allowing the state (i.e., the logical value) of the twin-cell CMOS NV RAM 100 to be read through READ transistor 136.

Figure 4B:
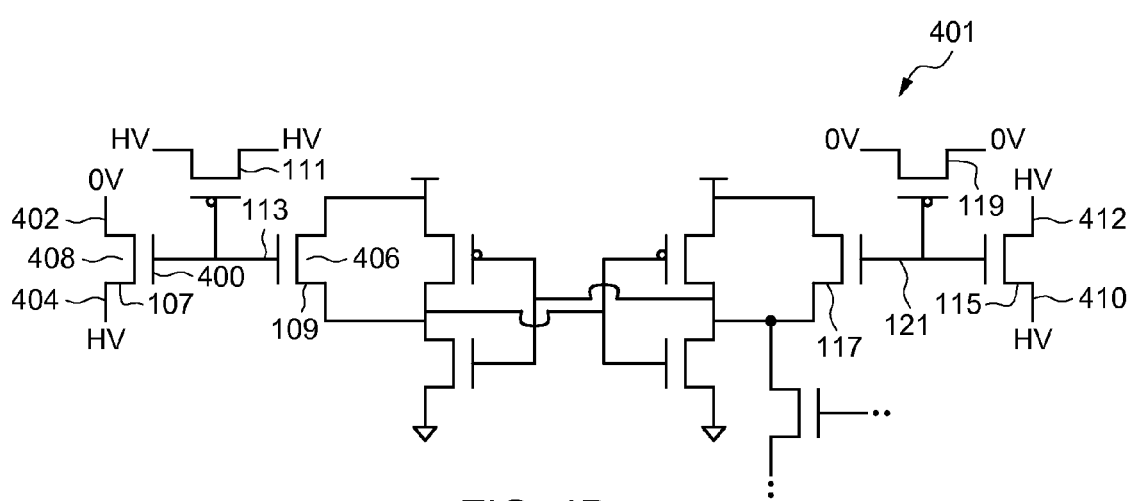
FIG. 4B is a circuit diagram of a twin-cell CMOS NV RAM suitable for channel hot electron programming according to an embodiment.

FIG. 4B is a circuit diagram of a twin-cell CMOS NV RAM 401 suitable for channel hot electron programming according to an embodiment. In this embodiment, the first and second tunneling transistors 107, 117 are NMOS FETs, while the coupling diffusion capacitors 111, 119 are PMOS devices. The P-well is biased to $V_{CC}$ and the N-well is biased to GROUND ("GND"). A high-voltage pulse (e.g., HV is about 4-5 V in an exemplary embodiment) applied to the second plate of the coupling diffusion capacitor 111 for about 10 msec while one S/D terminal 402 of the tunneling transistor 107 is held at zero Volts (ground) and the other S/D terminal of the tunneling transistor 107 is biased to HV.

Biasing the second plate of the coupling diffusion capacitor 111 to HV forms a capacitive voltage divider, similar to the capacitive voltage divider described above in reference to FIG. 4A. The voltage on the gate 400 of the tunneling transistor is slightly less than HV due to the division of voltage between the gate capacitance of the tunneling transistor 107 and the coupling capacitor 111. Electrons flowing across the channel of the tunneling FET 107 become energetic and tunnel through the gate oxide of the tunneling transistor 107 to the floating node 113 where the electric field is high. When the programming is completed, the floating poly 113 has an excess of electrons (i.e., is negatively charged), which turns off the channel 406 of the bitline transistor 109. This programs the first memory cell to a first data value ("data").

Using a second programming sequence, the second memory cell is programmed to the complementary data value ("data_bar") by grounding the well taps to the second coupling diffusion capacitor 119 and biasing the S/D terminals 410, 412 of the second tunneling transistor 115 to a high voltage (e.g., about 4-5 Volts in a particular embodiment) for a second duration of about 10 msec, as described above in reference to FIG. 4A. This causes a positive charge to accrue on the second floating node 121, turning the second bitline transistor 117 ON. While CHE programming was used to charge the first floating node 113 to a negative voltage (i.e., to transfer electrons to the floating poly structure), Fowler-Nordheim programming techniques are used to produce a positive charge on the second floating node. Fowler-Nordheim techniques may also be used to erase the first storage cell, or to program the first floating node to a positive voltage.

Figure 5:
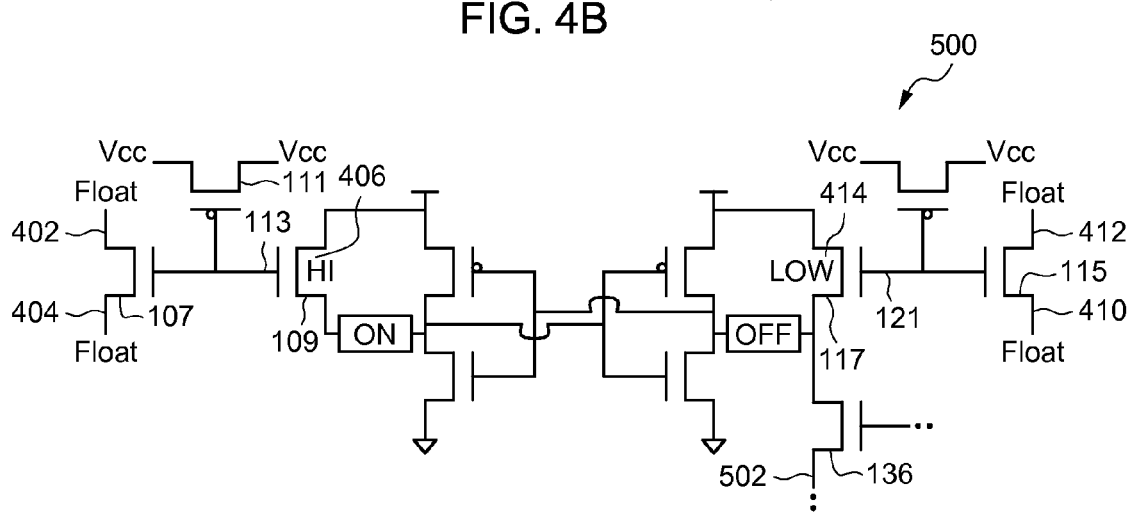
FIG. 5 is a circuit diagram illustrating self-maintained data according to an embodiment.

FIG. 5 is a circuit diagram 500 illustrating self-maintained data according to an embodiment. During a READ operation of the twin-cell NV RAM, the second plates (i.e., well taps) of the first and second coupling diffusion capacitors 111, 119 are biased to $V_{CC}$ and the S/D terminals 402, 402, 410, 412 of the first and second tunneling transistors 107, 115 are left floating. When the READ transistor 136 is turned ON, the electric fields formed through the floating nodes (poly structures) 113, 121 are favorable to self-sustaining charges on the floating nodes 113, 121.

For instance, if the left memory cell is programmed to a low $V_T$ and has relatively more holes and fewer electrons on the floating node 113, the first bitline transistor 109 is turned ON. This puts the channel 406 of the first bitline transistor 109 at a HI potential. The HI potential of the channel 406 is expelling holes of the floating poly 113 and simultaneously attracting electrons, which promotes maintaining the data value stored on the floating node 113.

Similarly, if the right memory cell is programmed to a high $V_T$ and has relatively more holes and fewer electrons on the floating node 121, the channel 414 of the second bitline transistor 117 is OFF. The relatively lower potential of the channel 414 tends to expel electrons, which prevents electrons from tunneling through the gate oxide and keep the electrons in the second floating node 121.

Although the twin-cell NV RAM needs two separate programming sequences, one to program the first memory cell to a first data value and a second to program the second memory cell to a complementary data value, which takes longer than a single programming sequence, interlacing of the twin memory cells in the NV RAM maintains opposite bit information in the complementary floating nodes 113, 121 and promotes data retention. The interlaced data values (bitline, bitline_bar) are also easily and quickly read by the SRAM inverters, which can sense small differences between the data values to rapidly provide an output 502 from the twin-cell NV RAM 500, even if there is charge lost from one or both floating nodes 113, 121. The twin-cell CMOS NV RAM 500 can be fabricated using conventional CMOS techniques, and thus is easily incorporated in CMOS ICs. The NV RAM can be fabricated using thin (less than 80 Angstroms) gate oxide layers, which avoids the need to grow thick tunneling oxide and promotes charge transfer during programming. The effects of charge loss through the thin oxide is mitigated by the self-maintaining aspect of the interlaced bitlines and the complementary nature of the data values provided to the SRAM inverters from the twin memory cells.

Figure 6:
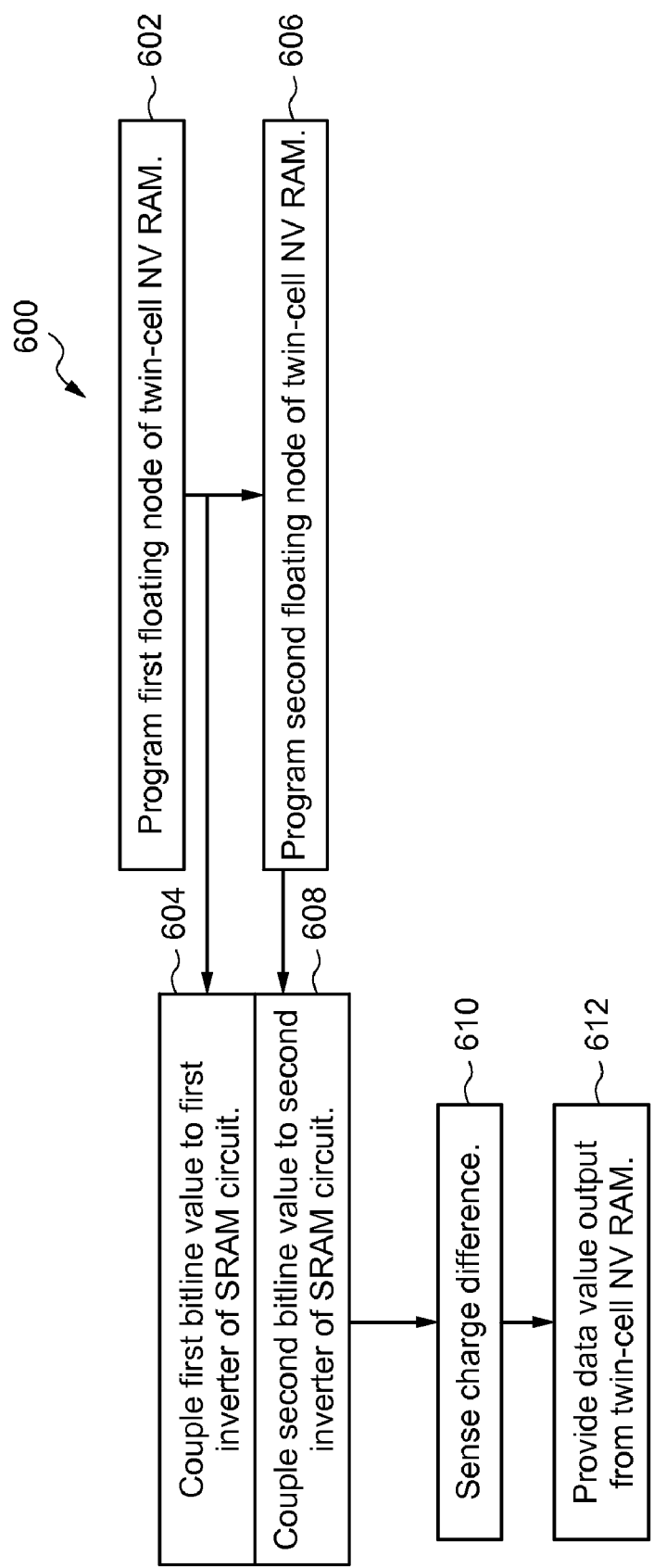
FIG. 6 is a flow chart of a method of operating a twin-cell CMOS NV RAM according to an embodiment.

FIG. 6 is a flow chart of a method 600 of operating a twin-cell NV RAM according to an embodiment. A first storage cell with a first floating node is programmed to a first data value (step 602). In a particular embodiment, electrons are added to (or holes are removed from) the first floating node through a tunneling transistor during the programming step to negatively charge the first floating node. In an alternative embodiment, electrons are removed from (or holes are added to) the first floating node through a tunneling transistor during the programming step to positively charge the first floating node. The first floating node includes a gate terminal of a first bitline transistor. A bitline value from the first bitline transistor is coupled to a first inverter of an interlaced inverter circuit (step 604).

After programming the first floating node (step 602), a second storage cell with a second floating node is programmed to a second data value (step 606) that is the complement of the first data value. The second floating node includes a gate terminal of a second bitline transistor. After the second programming step, a second bitline value of the second bitline transistor is coupled to a second inverter of the interlaced inverter circuit (step 608).

A charge difference between the first floating node and the second floating node during a READ operation (step 610) to provide a data value of the twin-cell NV RAM (step 612). In a further embodiment, charge is transferred to at least one of the first floating node and the second floating node during a READ operation. Even if substantial charge has been lost from one or both floating nodes, the interlaced SRAM circuit can detect the proper value of the twin-cell CMOS NV RAM as long as a slight differential is maintained.

Figure 7:
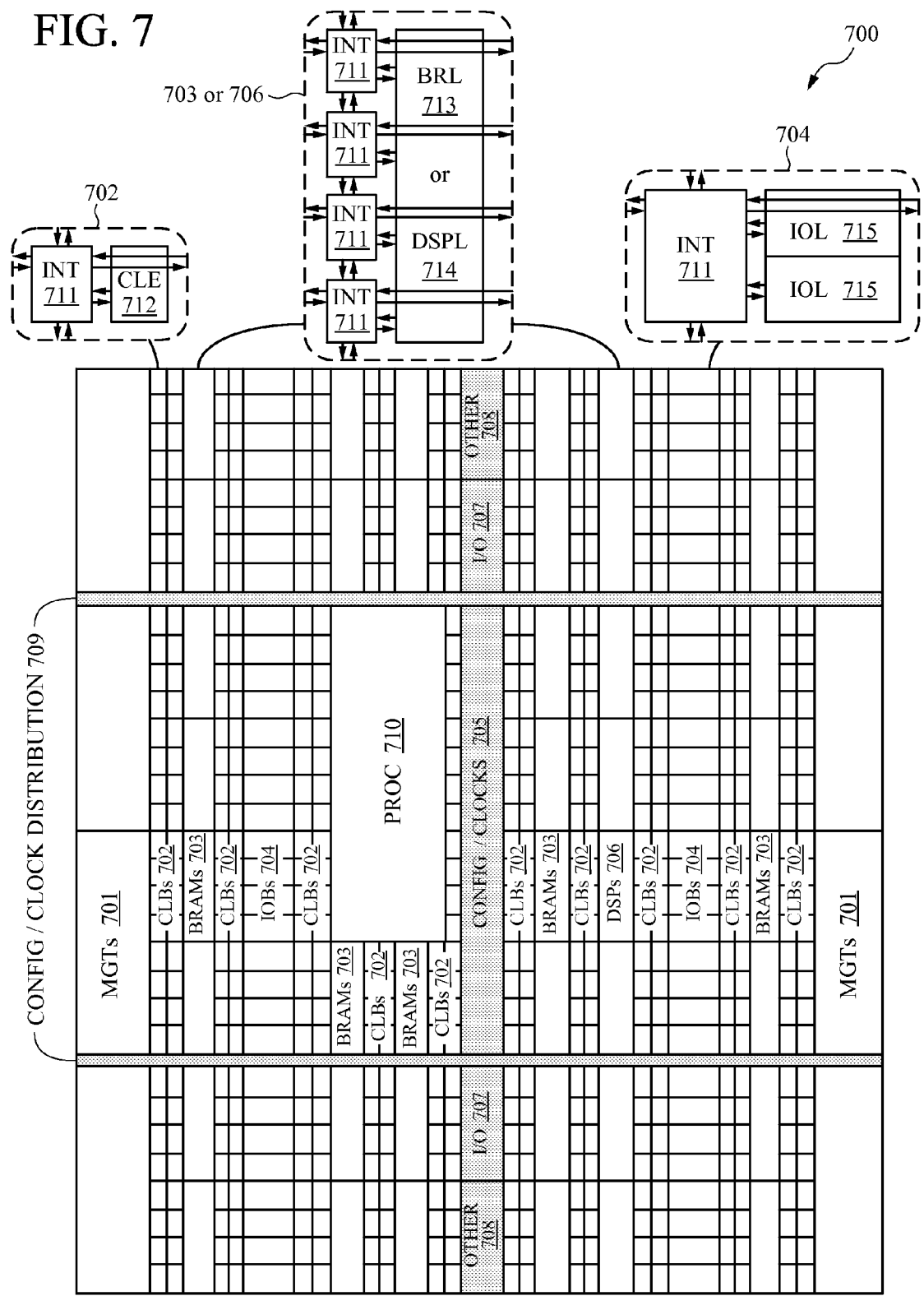
FIG. 7 is a plan view of an FPGA with CMOS NV RAM according to an embodiment of the invention.

FIG. 7 is a plan view of an FPGA 700 with a CMOS non-volatile memory block 720 having twin-cell NV RAM according to an embodiment of the invention. The FPGA is an integrated circuit that includes CMOS portions in several of the functional blocks, such as in RAM and logic, and is fabricated using a CMOS fabrication process. The CMOS non-volatile memory block is incorporated in a configurable logic block, but could be incorporated in many of several functional blocks, such as an embedded memory area or any semiconductor area where security, identification verification, or other non-volatile functionality is desired, of the FPGA 700, or could be incorporated into the FPGA as a stand-alone memory block interconnected to the FPGA with a programmable interconnect element. The CMOS non-volatile memory block is desirable to include in an FPGA because it can store data provided by the manufacturer, such as device and/or lot identification and tracking, security features to prevent unauthorized or unintentional use of or access to selected portions of the FPGA (which could be defined by the manufacturer or by the user), and provide non-volatile set-up or configuration memory, for example.

The FPGA architecture includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 503 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 are manufactured using metal layered above the various illustrated logic blocks, and typically are not confined to the area of the input/output logic element 715. In the pictured embodiment, a columnar area near the center of the die (shown shaded in FIG. 7) is used for configuration, clock, and other control logic.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, different types of materials may be used in alternative embodiments, and a twin-cell NV RAM might have any one of several different layouts and storage cell configurations. Additionally, while the invention has been described with specific reference to PLDs and more particularly to PLDs having CMOS components, embodiments of the invention are desirable in other applications using non-volatile memory. Other modifications may be apparent, or might become apparent, to those of skill in the art. Therefore, the spirit and scope of the appended claims should not be limited to the foregoing description.

The invention claimed is:

1. A memory comprising:
a first storage cell having a first floating node, a first tunneling transistor, a first coupling capacitor and a first bitline transistor, the first floating node including a first tunneling gate of the first tunneling transistor, a first plate of the first coupling capacitor and a first bitline gate of the first bitline transistor;
a second storage cell having a second floating node, a second tunneling transistor, a second coupling capacitor and a second bitline transistor, the second floating node including a second tunneling gate of the second tunneling transistor, a second plate of the second coupling capacitor and a second bitline gate of the second bitline transistor;
a first inverter coupled to a first bitline value from the first bitline transistor;
a second inverter interlaced with the first inverter and coupled to a second bitline value from the second bitline transistor, the second bitline value being complementary to the first bitline value, so as to sense a charge difference between the first floating node and the second floating node and provide a data output value of the memory when a memory read transistor is turned on.

2. The memory of claim 1 further comprising a gate dielectric layer between the first floating node and a semiconductor substrate, the gate dielectric layer being not more than 80 Angstroms thick.

3. The memory of claim 1 further comprising a gate dielectric layer between the first floating node and a semiconductor substrate, the gate dielectric layer being not more than 50 Angstroms thick.

4. The memory of claim 1 wherein the first floating node is a first floating polysilicon structure and the second floating node is a second floating polysilicon structure.

5. The memory of claim 1 wherein the first tunneling transistor is a PMOS transistor and the first bitline transistor is an NMOS transistor.

6. The memory of claim 5 wherein the first coupling capacitor is a PMOS device.

7. The memory of claim 1 wherein the first tunneling transistor and the first bitline transistor are each NMOS transistors.

8. The memory of claim 1 wherein the first bitline value is coupled to a pull-up node of the first inverter, the data output value being read through a read transistor connected to the pull-up node of the first inverter.

9. The memory of claim 1 wherein the first coupling capacitor has a first capacitance and the first tunneling gate has a second capacitance, the first capacitance being at least five times greater than the second capacitance.

10. A method of operating a non-volatile memory cell comprising: programming a first floating node of a first storage cell of the non-volatile memory cell to a first data value, wherein the first storage cell also includes a first tunneling transistor, a first coupling capacitor and a first bitline transistor, the first floating node includes a first tunneling gate of the first tunneling transistor, a first plate of the first coupling capacitor and a first bitline gate of the first bitline transistor;
programming a second floating node of a second storage cell of the non-volatile memory cell to a second data value, the second data value being complementary to the first data value, wherein the second storage cell also includes a second tunneling transistor, a second coupling capacitor and a second bitline transistor, the second floating node including a second tunneling gate of the second tunneling transistor, a second plate of the second coupling capacitor and a second bitline gate of the second bitline transistor;
coupling a first bitline value from the first storage cell to a first interlaced inverter;
coupling a second bitline value from the second storage cell to a second interlaced inverter, the second interlaced inverter being interlaced with the first interlaced inverter;
and sensing a charge difference between the first floating node and the second floating node to provide a data value of the non-volatile memory cell.

11. The method of claim 10 wherein charge on at least one of the first floating node and the second floating node is replenished when the non-volatile memory cell is read.

12. The method of claim 10 wherein the step of programming the first floating node comprises transferring charge through the first tunneling transistor, a portion of the charge being stored on a plate of the first coupling capacitor of the first floating node.

13. The method of claim 12 wherein the charge is transferred to the first floating node using a Fowler-Nordheim technique.

14. The method of claim 12 wherein the charge is transferred to the first floating node using a channel hot electron technique.

15. The method of claim 14 wherein the step of programming the second floating node comprises transferring opposite charge through a second tunneling transistor using a Fowler-Nordheim technique.

16. The memory of claim 1 wherein a channel of the first tunneling transistor is formed in an Nwell, the first plate of the first coupling capacitor being separated from the Nwell by a dielectric layer.

* * * * *